(12) United States Patent
Jo et al.

(10) Patent No.: US 12,057,404 B2
(45) Date of Patent: Aug. 6, 2024

(54) SEMICONDUCTOR DEVICE

(71) Applicant: Samsung Electronics Co., Ltd., Suwon-si (KR)

(72) Inventors: Chanmin Jo, Incheon (KR); Taeyoon Kim, Hwaseong-si (KR); Seungki Nam, Seoul (KR); Sungwook Moon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 413 days.

(21) Appl. No.: 17/644,716

(22) Filed: Dec. 16, 2021

(65) Prior Publication Data

US 2022/0344272 A1    Oct. 27, 2022

(30) Foreign Application Priority Data

Apr. 22, 2021  (KR) .................. 10-2021-0052557

(51) Int. Cl.
| | | |
|---|---|---|
| *H01L 23/48* | (2006.01) | |
| *H01L 21/48* | (2006.01) | |
| *H01L 23/538* | (2006.01) | |
| *H01L 25/065* | (2023.01) | |
| *H01L 25/18* | (2023.01) | |
| *H01L 23/00* | (2006.01) | |
| *H01L 23/367* | (2006.01) | |
| *H01L 23/498* | (2006.01) | |

(52) U.S. Cl.
CPC ........ *H01L 23/5386* (2013.01); *H01L 21/486* (2013.01); *H01L 25/0652* (2013.01); *H01L 25/18* (2013.01); *H01L 23/3675* (2013.01); *H01L 23/49811* (2013.01); *H01L 23/5384* (2013.01); *H01L 24/16* (2013.01); *H01L 2224/16227* (2013.01)

(58) Field of Classification Search
CPC .......... H01L 2224/16227; H01L 24/16; H01L 23/5384; H01L 23/49811; H01L 23/3675; H01L 23/5386

See application file for complete search history.

(56) References Cited

U.S. PATENT DOCUMENTS

| | | | |
|---|---|---|---|
| 4,782,193 A | 11/1988 | Linsker | |
| 4,875,139 A | 10/1989 | Fukui | |
| 5,281,151 A | 1/1994 | Arima et al. | |
| 6,784,531 B2 | 8/2004 | Tsuk et al. | |
| 10,811,358 B2 * | 10/2020 | Ha | ...................... H01L 23/5383 |
| 2010/0051326 A1 | 3/2010 | Sagisaka | |
| 2018/0047663 A1 | 2/2018 | Camarota | |

FOREIGN PATENT DOCUMENTS

| | | | |
|---|---|---|---|
| JP | 4731336 B2 | 4/2011 | |
| JP | 6385074 B2 | 9/2018 | |

* cited by examiner

*Primary Examiner* — Hoa B Trinh
(74) *Attorney, Agent, or Firm* — Myers Bigel, P.A.

(57) ABSTRACT

A semiconductor device includes pads of a first group and a plurality of first peripheral pads, which are adjacent to each other and spaced apart by a first horizontal gap in a first direction, and pads of a first group and a plurality of first peripheral pads, which are connected to each other and spaced apart by a first vertical gap, greater than the first horizontal gap, in a second direction. A plurality of first wiring patterns include first horizontal extension portions extending at an angle exceeding about 45 degrees with respect to the first direction within the first horizontal gap.

20 Claims, 16 Drawing Sheets

I-I'

SEMICONDUCTOR DEVICE

CROSS-REFERENCE TO RELATED APPLICATION

This application claims benefit of priority to Korean Patent Application No. 10-2021-0052557 filed on Apr. 22, 2021, in the Korean Intellectual Property Office, the disclosure of which is incorporated herein by reference in its entirety.

BACKGROUND

The present inventive concept relates to semiconductor devices.

In a semiconductor device used for high performance computing (HPC), high performance semiconductor chips having a large area may be mounted on a single substrate. High performance semiconductor chips may receive electrical power or may transmit signals through a wiring in a substrate. In particular, a finer pitch may be required for a wiring pattern used for transmitting the signals between the high performance semiconductor chips.

SUMMARY

An aspect of the present inventive concept may provide a semiconductor device having generally excellent signal characteristics.

According to an aspect of the present inventive concept, a semiconductor device includes a semiconductor chip; a first semiconductor structure adjacent to the semiconductor chip in a first direction; a second semiconductor structure adjacent to the semiconductor chip in the first direction and spaced apart from the first semiconductor structure in a second direction, perpendicular to the first direction; and a substrate including a plurality of pads electrically connected to the semiconductor chip, a plurality of first and second peripheral pads electrically connected to the first and second semiconductor structures, a plurality of first wiring patterns respectively connecting a first group of pads, among the plurality of pads, to the plurality of first peripheral pads, and a plurality of second wiring patterns respectively connecting a second group of pads, among the plurality of pads, to the plurality of second peripheral pads, and on which the semiconductor chip and the first and second semiconductor structures are mounted, wherein the first group of pads and the plurality of first peripheral pads, adjacent to each other, are spaced apart by a first horizontal gap in the first direction, and the first group of pads and the plurality of first peripheral pads, connected to each other, are spaced apart by a first vertical gap, greater than the first horizontal gap, in the second direction, the second group of pads and the plurality of second peripheral pads, adjacent to each other, are spaced apart from each other by a second horizontal gap in the first direction, and wherein the second group of pads and the plurality of second peripheral pads, connected to each other, are spaced apart by a second vertical gap, equal to or less than the second horizontal gap, in the second direction, wherein the plurality of first wiring patterns include first horizontal extension portions extending at an angle exceeding about 45 degrees with respect to the first direction within the first horizontal gap, and wherein the plurality of second wiring patterns include second horizontal extension portions extending at an angle of about 45 degrees or less with respect to the first direction within the second horizontal gap.

According to an aspect of the present inventive concept, a semiconductor device includes a semiconductor chip including first and second connection pads; a first semiconductor structure adjacent to the semiconductor chip in a first direction and including a first signal pad electrically connected to the first connection pad; a second semiconductor structure adjacent to the semiconductor chip in the first direction, spaced apart from the first semiconductor structure in a second direction, perpendicular to the first direction, and including a second signal pad electrically connected to the second connection pad; and a substrate including a first wiring pattern connecting the first connection pad and the first signal pad, and a second wiring pattern connecting the second connection pad and the second signal pad, wherein a first vertical gap between the first connection pad and the first signal pad in the second direction is greater than a second vertical gap between the second connection pad and the second signal pad in the second direction, wherein the first wiring pattern includes a first horizontal extension portion extending between the first connection pad and the first signal pad at a first angle with respect to the first direction, and wherein the second wiring pattern includes a second horizontal extension portion extending between the second connection pad and the second signal pad at a second angle, less than the first angle, with respect to the first direction.

According to an aspect of the present inventive concept, a semiconductor device includes a substrate; a semiconductor chip on the substrate; and a semiconductor structure adjacent to the semiconductor chip in a first direction and offset from the semiconductor chip in a second direction, perpendicular to the first direction, to be adjacent to an edge of the substrate, wherein the substrate includes a plurality of pads connected to the semiconductor chip, a plurality of peripheral pads connected to the semiconductor structure, and a plurality of wiring patterns electrically connecting at least a portion of the plurality of pads to at least a portion of the plurality of peripheral pads, wherein a separation distance between the at least a portion of the plurality of pads and the at least a portion of the plurality of peripheral pads, corresponding to each other, in the second direction is longer than the shortest distance between the at least a portion of the plurality of pads and the at least a portion of the plurality of peripheral pads in the first direction, and wherein the plurality of wiring patterns include horizontal extension portions extending at an angle greater than about 45 degrees to less than about 90 degrees with respect to the first direction and vertical extension portions extending from the horizontal extension portions at an angle of about 90 degrees with respect to the first direction, between the at least a portion of the plurality of pads and the at least a portion of the plurality of peripheral pads.

According to an aspect of the present inventive concept, an interposer substrate includes a plurality of pads; a plurality of peripheral pads spaced apart from the plurality of pads in a first direction; and a plurality of wiring patterns electrically connecting at least a portion of the plurality of pads to at least a portion of the plurality of peripheral pads, wherein a separation distance between the at least a portion of the plurality of pads and the at least a portion of the plurality of peripheral pads, corresponding to each other, in a second direction, perpendicular to the first direction, is longer than the shortest distance between the at least a portion of the plurality of pads and the at least a portion of the plurality of peripheral pads in the first direction, and wherein the plurality of wiring patterns include horizontal extension portions extending at an angle greater than about 45 degrees to less than about 90 degrees with respect to the first direction and vertical extension portions extending from the horizontal extension portions at an angle of about 90 degrees with respect to the first direction, between the at least a portion of the plurality of pads and the at least a portion of the plurality of peripheral pads.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments according to the technical idea of the present invention will be described referring to the accompanying drawings. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1A:
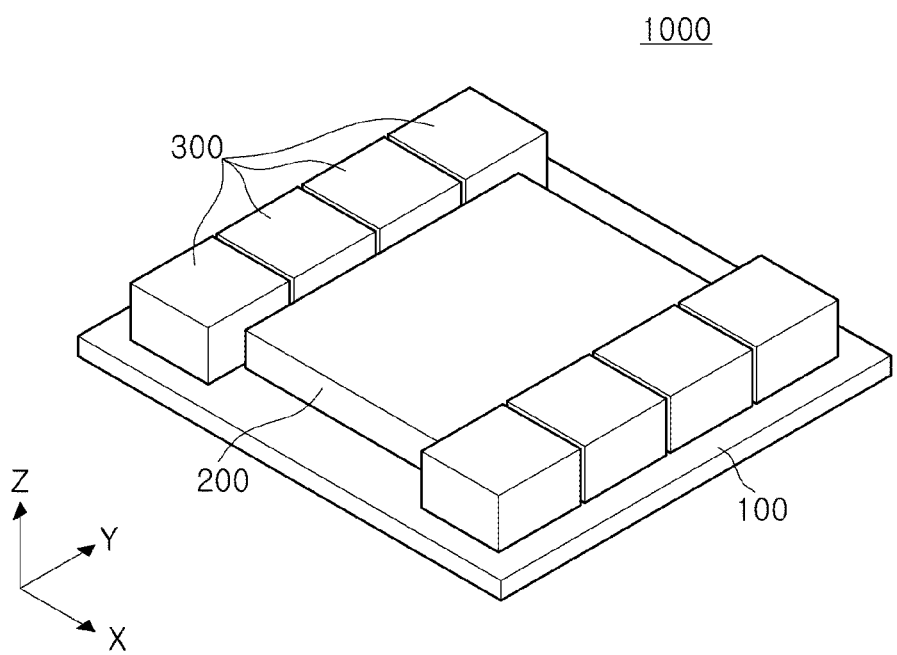
FIG. 1A is a perspective view illustrating a semiconductor device according to an embodiment of the present inventive concept.
Figure 1B:
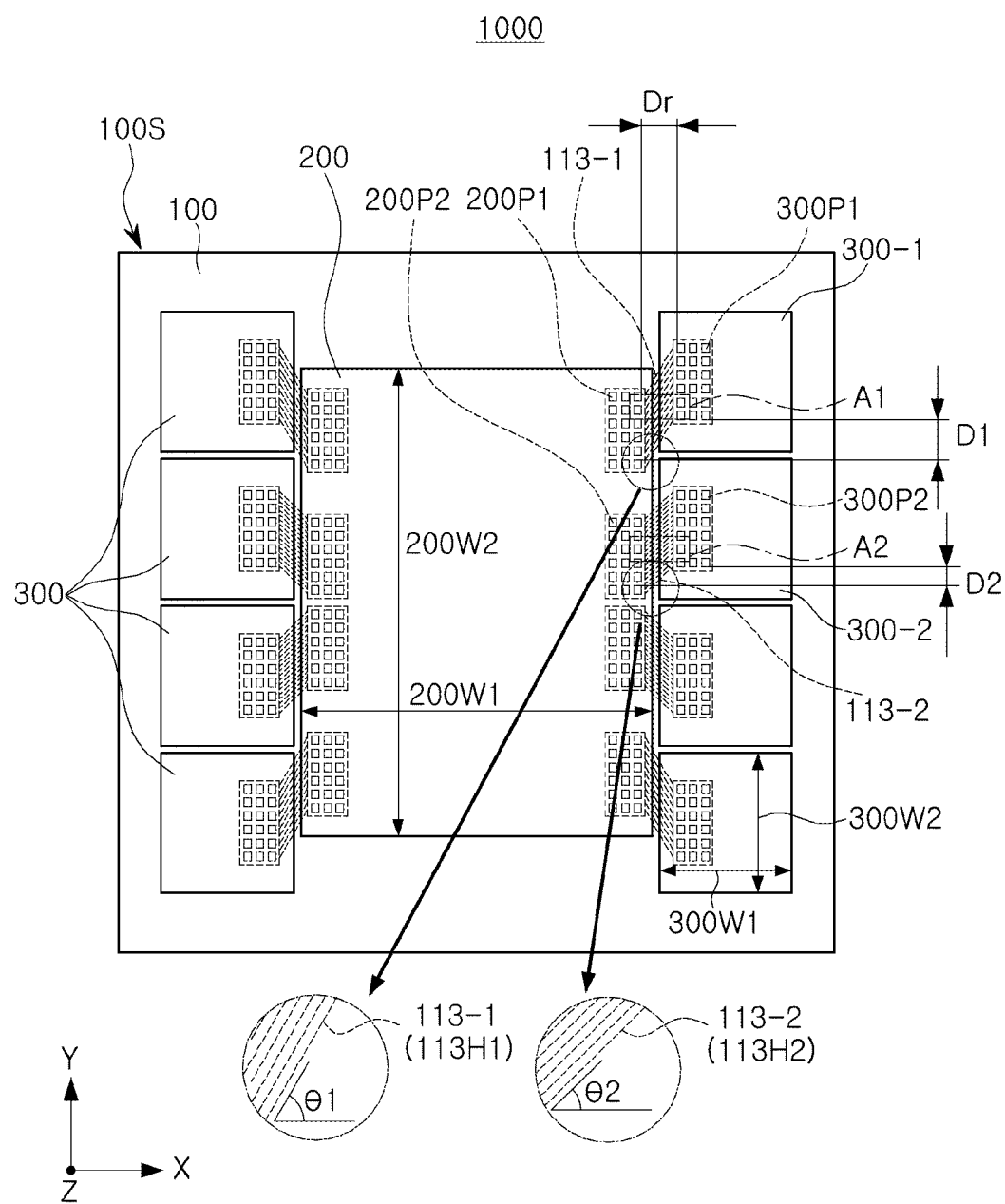
FIG. 1B is a plan view illustrating the semiconductor device of FIG. 1A.

FIG. 1A is a perspective view illustrating a semiconductor device 1000 according to an embodiment of the present inventive concept, and FIG. 1B is a plan view illustrating the semiconductor device 1000 of FIG. 1A.

Referring to FIGS. 1A and 1B, a semiconductor device 1000 may include a substrate 100, a semiconductor chip 200, and at least one semiconductor structure 300. According to the present inventive concept, the substrate 100 in which an angle of a wiring pattern is adjusted according to a specific condition (e.g., arrangement between the semiconductor chip 200 and the semiconductor structure 300) may be introduced to reduce or prevent crosstalk phenomenon between wiring patterns, and as a result, the semiconductor device 1000 may have improved performance and signal characteristics.

Figure 2A:
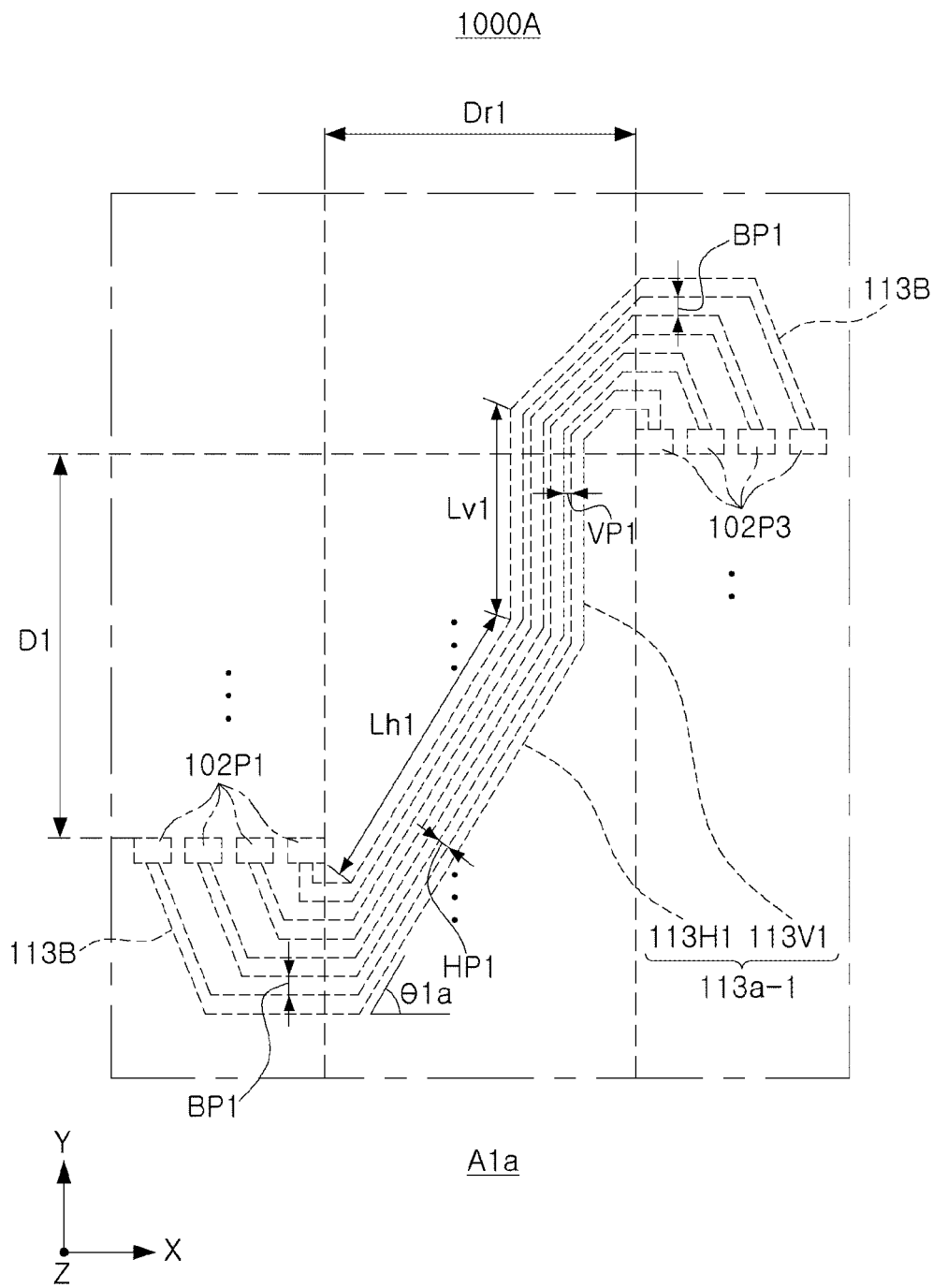
FIGS. 2A and 2B are enlarged views illustrating partial regions of a semiconductor device according to an embodiment of the present inventive concept.
Figure 2B:
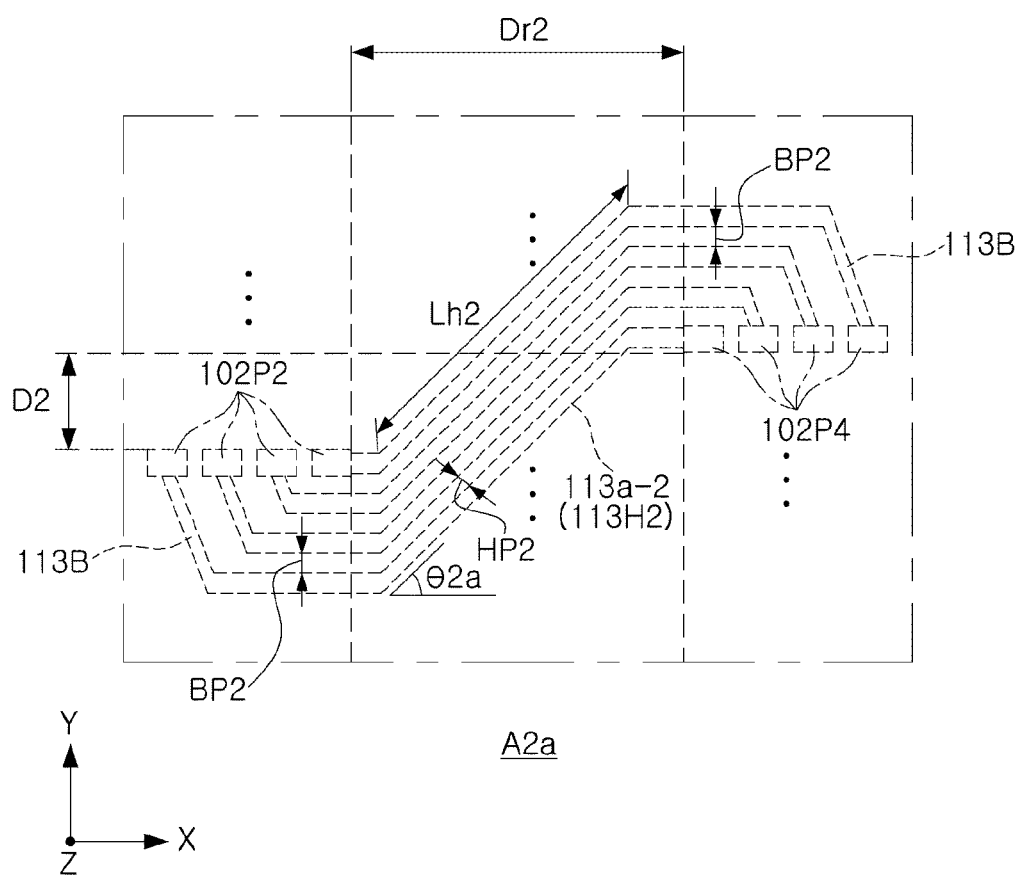

The substrate 100 may be a support substrate on which the semiconductor chip 200 and the at least one semiconductor structure 300 are mounted, and may include a plurality of pads ('102P1' and '102P2' in FIGS. 2A and 2B) connected to connection pads 200P1 and 200P2 of the semiconductor chip 200, a plurality of peripheral pads ('102P3' and '102P4' in FIGS. 2A and 2B) connected to signal pads 300P1 and 300P2 of the semiconductor structure 300, and a plurality of wiring patterns 113-1 and 113-2 electrically connecting at least a portion of the plurality of pads ('102P1' and '102P2' in FIGS. 2A and 2B) to at least a portion of the plurality of peripheral pads ('102P3' and '102P4' in FIGS. 2A and 2B). For example, the substrate 100 may include first wiring patterns 113-1 connecting a first group of connection pads 200P1 to a first signal pad 300P1, and second wiring patterns 113-2 connecting a second group of connection pads 200P2 to a second signal pad 300P2.

The substrate 100 may be a substrate including a printed circuit board (PCB), a ceramic substrate, a glass substrate, a tape wiring board, or the like. The substrate 100 may be a large-area package substrate for mounting the high performance semiconductor chip 200 and the high performance semiconductor structure 300. For example, the substrate 100 may have a planar shape, such as a square, a rectangle, or the like, and a traverse length and/or a longitudinal length of the substrate 100 may be 40 mm or more.

To connect a high performance semiconductor chip and a high performance semiconductor structure to each other, because a large number of routing wirings may be required to respond to input/output terminals of the semiconductor chip 200 and the semiconductor structure 300 (e.g., the connection pads 200P1 and 200P2 and the signal pads 300P1 and 300P2), and high-density routing wirings (e.g., the first and second wiring patterns 113-1 and 113-2) may be formed in a limited routing region (e.g., a region between the connection pads 200P1 and 200P2 of the semiconductor chip 200 and the signal pads 300P1 and 300P2 of the semiconductor structure 300), signal characteristics may deteriorate due to a coupling effect between the routing wirings or the like. In particular, in routing wirings (e.g., '113V1' in FIG. 2A) running in a vertical direction (e.g., in a Y-axis direction) in the routing region, because a gap between the routing wirings may be very narrow, signal characteristics may be further deteriorated.

In the present inventive concept, in consideration of a width of the routing region (for example, the shortest distance Dr between each of the connection pads 200P1 and 200P2 and each of the signal pads 300P1 and 300P2, adjacent to each other) and a vertical distance used for routing (for example, vertical distances D1 and D2 between each of the connection pads 200P1 and 200P2 and each of the signal pads 300P1 and 300P2, connected to each other), angles of the routing wirings may be controlled, to reduce a length of a wiring in the routing region and/or to reduce or minimize a portion of a wiring proceeding in the vertical direction (e.g., the Y-axis direction) in the routing region. Therefore, signal characteristics between the semiconductor chip 200 and the semiconductor structure 300 may be improved. "Dr" illustrated in FIG. 1B may refer to a gap between each of the connection pads 200P1 and 200P2 and each of the signal pads 300P1 and 300P2 in a first direction (an X-axis direction), in the routing region between the semiconductor chip 200 and the semiconductor structure 300, hereinafter, referred to as a "separation distance," a "horizontal gap," and the like. In addition, although "Dr" may be expressed as a width from one end of each of the connection pads 200P1 and 200P2 to one end of each of the signal pads 300P1 and 300P2, it can be understood as being spaced apart from the connection pads 200P1 and 200P2 and the signal pad 300P1 and 300P2 by a predetermined distance, based on a process margin or the like.

For example, the semiconductor device 1000, according to an embodiment, may include a first semiconductor structure 300-1 disposed adjacent to the semiconductor chip 200 in the first direction (the X-axis direction) and including the first signal pad 300P1 electrically connected to the first connection pad 200P1, and a second semiconductor structure 300-2 disposed adjacent to the semiconductor chip 200 in the first direction (the X-axis direction), spaced apart in the second direction (the Y-axis direction), perpendicular to the first direction (the X-axis direction), and including the second signal pad 300P2 electrically connected to the second connection pad 200P2. In this case, the first semiconductor structure 300-1 may be disposed adjacent to an edge 100S of the substrate 100, compared to the second semiconductor structure 300-2, in the second direction (the Y-axis direction), and the first and second connection pads 200P1 and 200P2 may be located to be offset from the first and second signal pads 300P1 and 300P2, respectively, in the first direction (the X-axis direction). For example, the first connection pad 200P1 and the first signal pad 300P1 may be spaced apart from each other by a first vertical gap D1 in the second direction (the Y-axis direction), the second connection pad 200P2 and the second signal pad 300P2 may be spaced apart from each other by a second vertical gap D2 in the second direction (the Y-axis direction), and the first vertical gap D1 may be greater than the second vertical gap D2.

In this case, the first wiring pattern 113-1 may include a first horizontal extension portion 113H1 extending at a first angle θ1 with respect to the first direction (the X-axis direction) in a region (e.g., Dr) between the first connection pad 200P1 and the first signal pad 300P1, and the second wiring pattern 113-2 may include a second horizontal extension portion 113H2 extending at a second angle θ2, less than the first angle θ1, with respect to the first direction (the X-axis direction) in a region (e.g., Dr) between the second connection pad 200P2 and the second signal pad 300P2. In this manner, according to the first and second vertical gaps D1 and D2, angles of the first and second wiring patterns 113-1 and 113-2 may be changed to reduce or minimize portions of the first and second wiring patterns 113-1 and 113-2 running in the longitudinal and vertical direction (e.g., the Y-axis direction), in the routing region. Therefore, signal characteristics between the semiconductor chip 200 and the semiconductor structure 300 may be improved.

Also, in an example, the first vertical gap D1 may be greater than a first horizontal distance Dr between the first connection pad 200P1 and the first signal pad 300P1, and the second vertical gap D2 may be equal to or less than a second horizontal distance Dr between the second connection pad 200P2 and the second signal pad 300P2. In this case, the first angle θ1 of the first horizontal extension portion 113H1 may be about 60 degrees or more, for example, about 60 degrees to about 90 degrees, or about 60 degrees to about 75 degrees, and the second angle θ2 of the second horizontal extension portion 113H2 may be about 45 degrees or less, for example, about 45 degrees to about 0.1 degrees, or about 30 degrees to about 15 degrees. In other embodiments, the second horizontal extension portion 113H2 may extend parallel to the first direction (the X-axis direction) (e.g., the second angle θ2 may be 0 degree).

Also, in an example, at least one of the first or second wiring patterns 113-1 or 113-2 may further include a vertical extension portion (referring to '113V1' and '113V2' in FIGS. 2A and 4) extending from one end of the first or second horizontal extension portion 113H1 or 113H2 at a third angle θ3, greater than the first and second angles θ1 and θ2, with respect to the first direction (the X-axis direction). In this case, the third angle θ3 may be about 90 degrees or greater, for example, about 90 degrees to about 105 degrees, or about 90 degrees to about 95 degrees, and a length of the vertical extension portion (referring to '113V1' and '113V2' in FIGS. 2A and 4) may be shorter than a length of each of the first and second horizontal extension portions 113H1 and 113H2 in an extension direction. In this manner, lengths of the first and second wiring patterns 113-1 and 113-2 running in the vertical direction (the Y-axis direction) in the routing region may be reduced or minimized to improve signal characteristics. This will be described below with reference to FIGS. 2A and 4. In this case, "about 90 degrees" may be interpreted somewhat broadly in consideration of a process error or the like. For example, the third angle θ3 may include an angle ranging about 85 degrees to about 95 degrees.

The semiconductor chip 200 may be disposed on the substrate 100 and may include a plurality of connection pads. Although only the connection pads 200P1 and 200P2 connected to the semiconductor structures 300 are illustrated in FIG. 1B, it can be understood that the semiconductor chip 200 may further include connection pads connected to the outside through a wiring of the substrate 100. The semiconductor chip 200 may include, for example, a logic chip, such as a central processor (CPU), a graphics processor (GPU), a field programmable gate array (FPGA), a digital signal processor (DSP), a cryptographic processor, a microprocessor, a microcontroller, an analog-to-digital converter, and/or an application-specific IC (ASIC). In an embodiment, the semiconductor chip 200 may be a high performance semiconductor chip having a generally large area. For example, the semiconductor chip 200 may have a width 200W1 in the first direction (the X-axis direction) and a width 200W2 in the second direction (the Y-axis direction), greater than a width 300W1 of the semiconductor structure 300 in the first direction (the X-axis direction) and a width 300W2 of the semiconductor structure 300 in the second direction (the Y-axis direction), respectively.

In an embodiment, a plurality of semiconductor structures 300 may be disposed on one side of the semiconductor chip 200, and some of the semiconductor structures (e.g., 300-1) may be disposed to protrude, compared to the semiconductor chip 200, in one direction (e.g., the Y-axis direction). For example, in the second direction (the Y-axis direction), the first semiconductor structure 300-1 may be disposed closer to the edge 100S of the substrate 100, compared to the semiconductor chip 200. In this case, as described above, the first connection pad 200P1 of the semiconductor chip 200 and the first signal pad 300P1 of the first semiconductor structure 300-1 may be spaced apart from each other by the first vertical gap D1 in the second direction (the Y-axis direction).

The semiconductor structure 300 may be disposed adjacent to the semiconductor chip 200, and may include a plurality of signal pads. Although only the signal pads 300P1 and 300P2 connected to the semiconductor chip 200 are illustrated in FIG. 1B, it can be understood that the semiconductor structure 300 may further include power pads and ground pads, connected to the outside of the semiconductor structure 300 through the wiring of the substrate 100. The semiconductor structure 300 may be a memory device including at least one memory chip. For example, the semiconductor structure 300 may include a volatile memory device, such as a dynamic RAM (DRAM), a static RAM (SRAM), a phase change RAM (PRAM), a magnetic RAM (MRAM), a resistive RAM (RRAM), a flash memory device, and the like, and a high performance memory device, such as a high bandwidth memory (HBM), a hybrid memory cubic (HMC), and the like.

In an embodiment, at least one semiconductor structure 300 may be disposed to be offset from the semiconductor chip 200 to be closer to the edge 100S of the substrate 100, compared to the semiconductor chip 200, in the second direction (the Y-axis direction). For example, the first semiconductor structure 300-1 may be disposed closer to the edge 100S of the substrate 100, compared to the second semiconductor structure 300-2, and the second semiconductor structure 300-2 may be disposed adjacent to the semiconductor chip 200 in the first direction (the X-axis direction), and may be spaced apart from the first semiconductor structure 300-1 in the second direction (the Y-axis direction).

FIGS. 2A and 2B are enlarged views illustrating partial regions of a semiconductor device 1000A according to an embodiment of the present inventive concept. FIG. 2A illustrates some components in a region corresponding to "A1" in FIG. 1B, and FIG. 2B illustrates some components in a region corresponding to "A2" in FIG. 1B. It can be understood that first and second groups of pads 102P1 and 102P2 illustrated in FIGS. 2A and 2B are upper pads of the substrate 100 connected to the first and second groups of the connection pads 200P1 and 200P2 in FIG. 1B. In FIGS. 2A and 2B, the pads 102P1 and 102P2 are not illustrated to correspond in a 1:1 manner to the connection pads 200P1 and 200P2 illustrated in FIG. 1B.

Referring to FIG. 2A, in a semiconductor device 1000A according to an embodiment, first wiring patterns 113a-1 may further include vertical extension portions 113V1 extending from one set of ends of first horizontal extension portions 113H1 at an angle of about 90 degrees with respect to the first direction (the X-axis direction), in a first horizontal gap Dr1. In addition, the first wiring patterns 113a-1 may further include pad connection portions 113B extending from the first horizontal extension portions 113H1 and the vertical extension portions 113V1 that are configured to be connected to the first group of pads 102P1 and the first peripheral pad 102P3. An extension direction or gap BP1 of the pad connection portions 113B is not particularly limited, and may be variously changed to have a form different from that illustrated in the drawings.

In an embodiment, a separation distance (or "first vertical gap") D1 between a first group of pads 102P1 and first peripheral pads 102P3, corresponding to each other, in the second direction (the Y-axis direction) may be greater than the shortest distance (or "first horizontal gap") Dr1 between the first group of pads 102P1 and the first peripheral pads 102P3 in the first direction (the X-axis direction). For example, a ratio of the first vertical gap D1 to the first horizontal gap Dr1 may be about 1.0 or more, or about 1.3 or more, or about 1.5 or more, for example, about 1.5 to about 4, or about 1.5~about 3. The ratio of the first vertical gap D1 to the first horizontal gap Dr1 is not limited to the above-described numerical values. Although the first horizontal gap Dr1 is expressed as a width from one set of ends of the first group of pads 102P1 to one set of ends of the first peripheral pads 102P3, it can be understood that the first group of pads 102P1 are spaced apart from the first peripheral pads 102P3 by a predetermined distance, based on a process margin or the like.

In addition, the first wiring patterns 113a-1 may include first horizontal extension portions 113H1 extending between the first group of pads 102P1 and the first peripheral pads 102P3, at an angle $\theta 1a$ of greater than about 45 degrees and less than 90 degrees with respect to the first direction (the X-axis direction), and vertical extension portions 113V1 extending from the first horizontal extension portions 113H1 at an angle of about 90 degrees with respect to the first direction (the X-axis direction). In this case, "about 90 degrees" indicating an extension angle of the first vertical extension portions 113V1 may be interpreted somewhat broadly in consideration of a process error or the like, and, for example, may include an angle ranging from about 85 degrees to about 95 degrees.

According to embodiments of the present inventive concept, lengths of the first vertical extension portions 113V1 running in the vertical direction (the Y-axis direction) in the routing region may be reduced or minimized to improve signal characteristics of the semiconductor device 1000A. In an embodiment, a gap VP1 between the first vertical extension portions 113V1 may be less than a gap HP1 between the first horizontal extension portions 113H1, and a length Lv1 of each of the first vertical extension portions 113V1 in the extension direction may be shorter than a length Lh1 of each of the first horizontal extension portions 113H1 in the extension direction. In an example, a ratio of the length Lv1 of each of the first vertical extension portions 113V1 in the extension direction to the first vertical gap D1 may be about 0.2 or less, for example, about 0.2 to about 0.1, or about 0.2 to about 0.01. In an example, when the first vertical gap D1 is about 4,500 μm, the length Lh1 of each of the first horizontal extension portions 113H1 may be about 4,400 μm, and the length Lv1 of each of the vertical extension portions 113V1 may be about 700 μm.

Referring to FIG. 2B, in the semiconductor device 1000A according to the embodiment, second wiring patterns 113a-2 may not include the vertical extension portions 113V1 illustrated in FIG. 2A in a second horizontal gap Dr2. In this case, it can be understood that the second horizontal gap Dr2 is substantially equal to the first horizontal gap Dr1 of FIG. 2A. It can be understood that, as the second horizontal gap Dr2, a second group of pads 102P2 are spaced apart from second peripheral pads 102P4 by a predetermined distance, similarly to the first horizontal gap Dr1. In addition, the second wiring patterns 113a-2 may further include pad connection portions 113B extending from second horizontal extension portions 113H2 and connected to the second group of pads 102P2 and the second peripheral pads 102P4. An extension direction or gap BP2 of the pad connection portions 113B is not particularly limited, and may be variously changed to have a form different from that illustrated in the drawings in accordance with different embodiments.

For example, the second group of pads 102P2 and the plurality of second peripheral pads 102P4, adjacent to each other, may be spaced apart from each other by the second horizontal gap Dr2 in the first direction (the X-axis direction), and the second group of pads 102P2 and the plurality of second peripheral pads 102P4, connected to each other, may be spaced apart from each other by a second vertical gap D2, equal to or less than the second horizontal gap Dr2, in the second direction (the Y-axis direction). For example, a ratio of the second vertical gap D2 to the second horizontal gap Dr2 may be about 1 or less, for example, about 1.0 to about 0.5, or about 1.0 to about 0.1, or about 0.8 to about 0.1, or from about 0.5 to about 0.1. The ratio of the second vertical gap D2 to the second horizontal gap Dr2 is not limited to the above-described numerical values. For example, the second vertical gap D2 may be substantially close to zero (0).

In addition, the plurality of second wiring patterns 113$a$-2 may include second horizontal extension portions 113H2 extending at an angle θ2$a$ of about 45 degrees or less, for example, an angle ranging from about 45 degrees to about 0.1 degrees, or from about 30 degrees to about 15 degrees, with respect to the first direction (the X-axis direction) in the second horizontal gap D2. A gap HP2 between the second horizontal extension portions 113H2 may be similar to the gap BP2 of the pad connection portions 113B, and may be greater than the gap HP1 between the first horizontal extension portions 113H1 of FIG. 2A.

As such, when a ratio of a longitudinal length (in the Y-axis direction) between routing target pads to a traverse length (in the X-axis direction) in a routing region is 1 or less, a wiring pattern running in the vertical direction (in the embodiments Y-axis direction) in the routing region may not be included to reduce or prevent a coupling phenomenon between wiring patterns and to minimize a wiring length.

Figure 3:
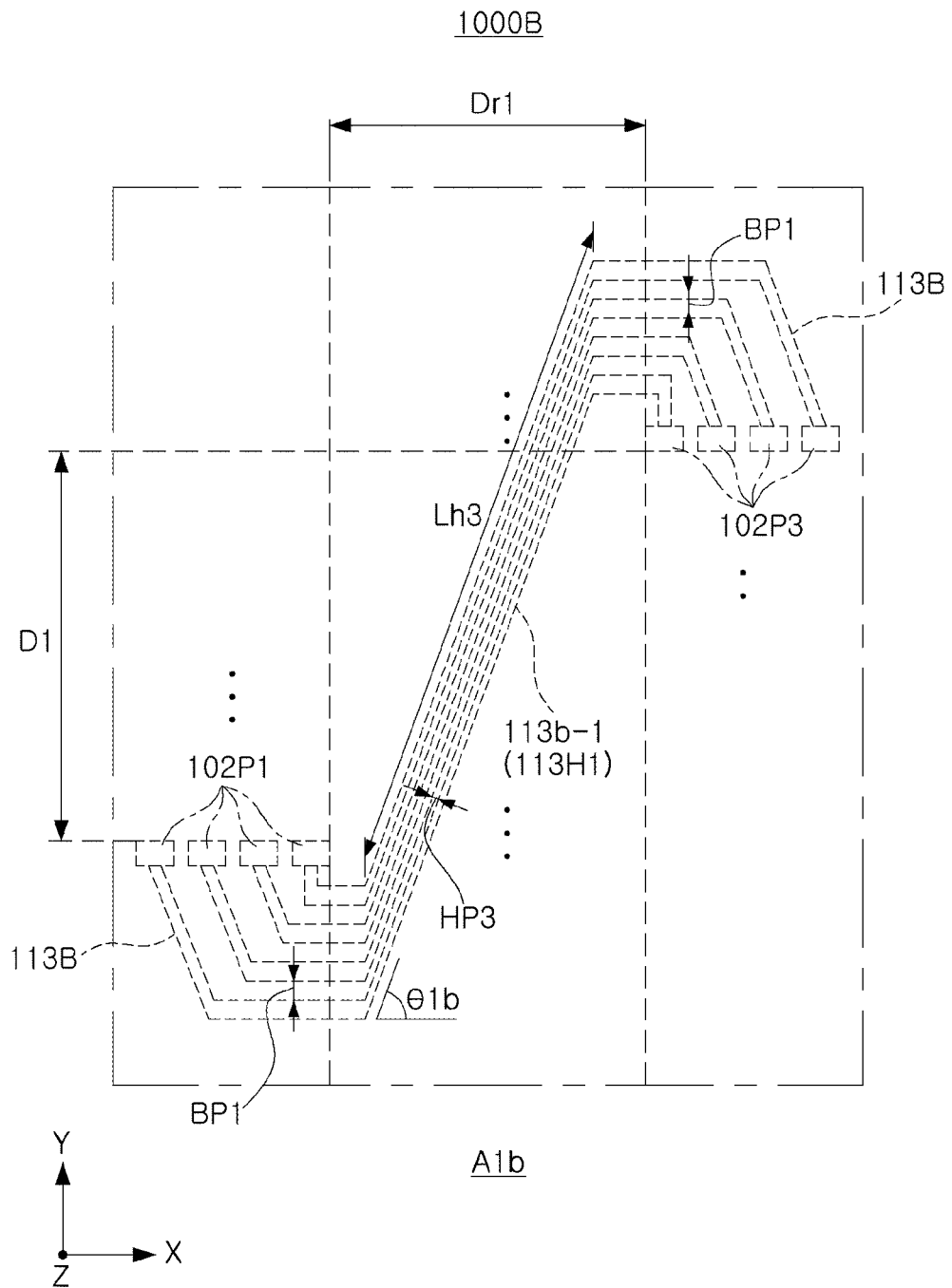
FIG. 3 is an enlarged view illustrating partial regions of a semiconductor device according to an embodiment of the present inventive concept.

FIG. 3 is an enlarged view illustrating partial regions of a semiconductor device 1000B according to an embodiment of the present inventive concept.

Referring to FIG. 3, a semiconductor device 1000B according to an embodiment may be similar to those described with reference to FIGS. 1A to 2B, except that first wiring patterns 113$b$-1 do not include the vertical extension portions 113V1 illustrated in FIG. 2A, in a first horizontal gap Dr1. In FIGS. 3 and 2A, the first horizontal gaps Dr1 may have the same width, but embodiments are not limited thereto.

In an embodiment, a separation distance (or "first vertical gap") D1 between a first group of pads 102P1 and first peripheral pads 102P3, corresponding to each other, in the second direction (the Y-axis direction), may be greater than the shortest distance (or "first horizontal gap") Dr1 between the first group of pads 102P1 and the first peripheral pads 102P3 in the first direction (the X-axis direction). The first horizontal gap Dr1 and the first vertical gap D1 may have a ratio similar to that described with reference to FIG. 2A.

In addition, the first wiring patterns 113$b$-1 may include first horizontal extension portions 113H1 extending at an angle θ1$b$ of greater than about 45 degrees and less than about 90 degrees in the first direction (the X-axis direction), between the first group of pads 102P1 and the first peripheral pad 102P3. For example, the first horizontal extension portions 113H1 may extend at an angle θ1$b$ of about 75 degrees with respect to the first direction (the X-axis direction). In the present embodiment, a gap HP3 between the first horizontal extension portions 113H1 may be less than the gap HP1 between the first horizontal extension portions 113H1 of FIG. 2A, and may be greater than the gap VP1 between the first vertical extension portions 113V1 of FIG. 2A. The "about 75 degrees" may include a process error, and for example, may be interpreted as an angle of about 70 degrees to about 80 degrees.

In this manner, even when a ratio of a longitudinal length (in the Y-axis direction) between routing target pads to a traverse length (in the X-axis direction) in a routing region exceeds 1, a wiring pattern running in the vertical direction (in the Y-axis direction) in the routing region may not be included to reduce or prevent a coupling phenomenon between wiring patterns and to reduce or minimize a wiring length.

Figure 4:
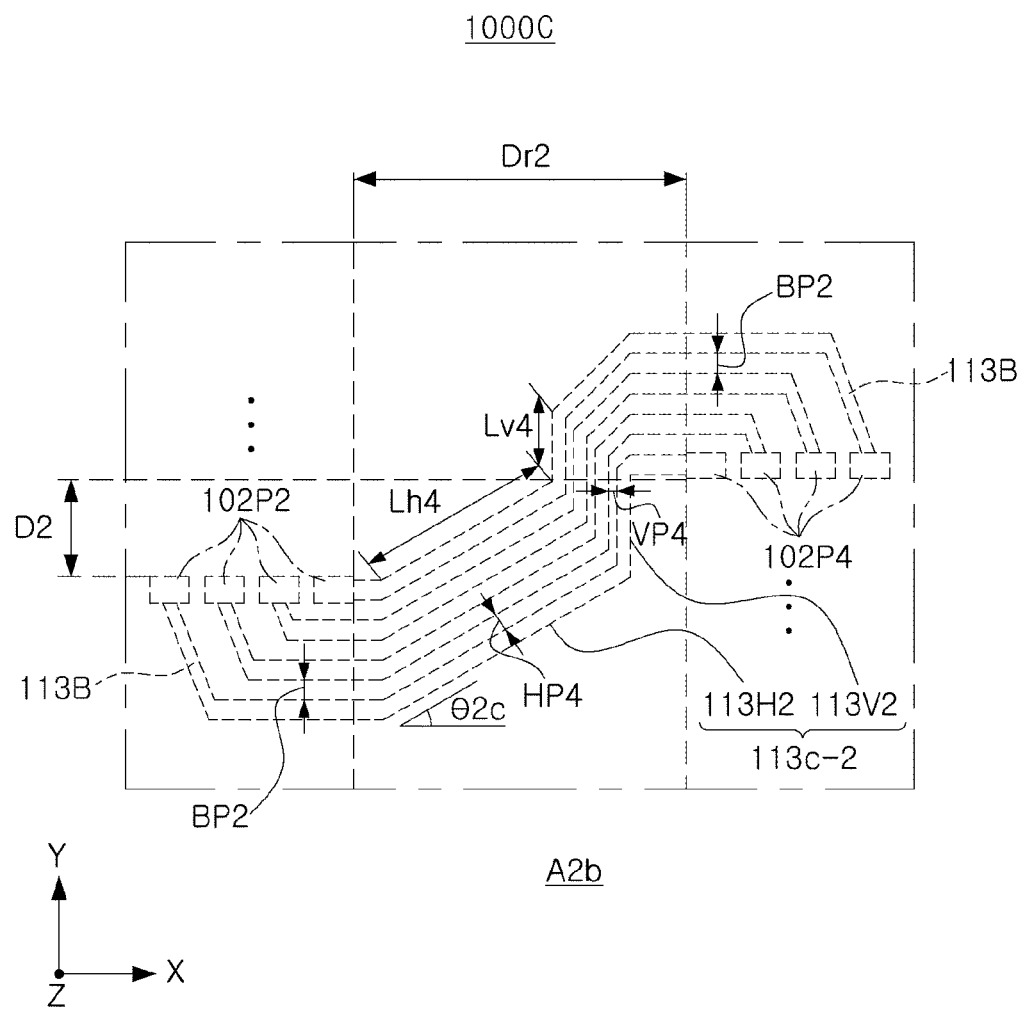
FIG. 4 is an enlarged view illustrating partial regions of a semiconductor device according to an embodiment of the present inventive concept.

FIG. 4 is a partially enlarged view illustrating partial regions of a semiconductor device 1000C according to an embodiment of the present inventive concept.

Referring to FIG. 4, a semiconductor device 1000C according to an embodiment may be similar to those described with reference to FIGS. 1A to 3, except that second vertical extension portions 113V2 in which second wiring patterns 113$c$-2 extend from one set of ends of second horizontal extension portions 113H2 at an angle of about 90 degrees with respect to the first direction (the X-axis direction) in a second horizontal gap Dr2 are further included. In FIGS. 4 and 2B, the second horizontal gaps Dr2 may have the same width, but embodiments are not limited thereto.

In an embodiment, a separation distance (or "second vertical gap") D2 between a second group of pads 102P2 and second peripheral pads 102P4, corresponding to each other, in the second direction (the Y-axis direction) may be equal to or less than the shortest distance (or "second horizontal gap") Dr2 between the second group of pads 102P2 and the second peripheral pads 102P4 in the first direction (the X-axis direction). The second horizontal gap Dr2 and the second vertical gap D2 may have a ratio similar to that described in FIG. 2B.

In addition, the second wiring patterns 113$c$-2 may include second horizontal extension portions 113H2 extending at an angle θ2$c$ of about 45 degrees or less, for example, about 30 degrees to about 15 degrees, with respect to the first direction (the X-axis direction) and second vertical extension portions 113V2 extending from the second horizontal extension portions 113H2 at an angle of about 90 degrees with respect to the first direction (the X-axis direction), between the second group of pads 102P2 and the second peripheral pad 102P4. For example, the second horizontal extension portions 113H2 may extend at an angle θ2$c$ of about 30 degrees with respect to the first direction (the X-axis direction). In this case, "about 30 degrees" may include a process error, and for example, may be interpreted as an angle of about 25 degrees to about 35 degrees.

In an embodiment, a gap VP4 between the second vertical extension portions 113V2 may be smaller than a gap HP4 between the second horizontal extension portions 113H2, and a length Lv4 of the second vertical extension portions 113V2 in the extension direction may be shorter than a length Lh4 of the second horizontal extension portions 113H2 in the extension direction.

Figure 5:
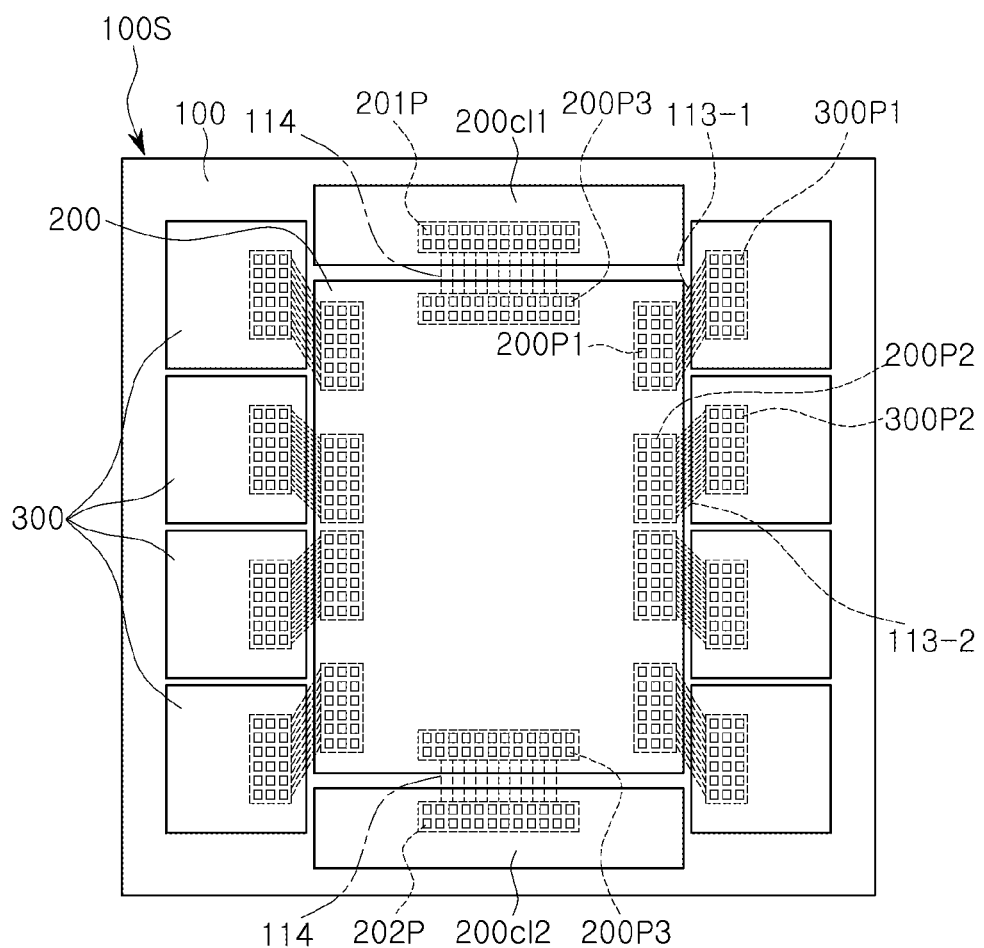
FIG. 5 is a plan view illustrating a semiconductor device according to an embodiment of the present inventive concept.

FIG. 5 is a plan view illustrating a semiconductor device 1000D according to an embodiment of the present inventive concept.

Referring to FIG. 5, a semiconductor device 1000D according to an embodiment may be similar to those described with reference to FIGS. 1A to 4, except that at least one chiplet 200$c$11 or 200$c$12 disposed adjacent to a semiconductor chip 200 on a substrate 100 is further included. For example, a semiconductor device 1000D may further include first and second chiplets 200$c$11 and 200$c$12, disposed adjacent to a semiconductor chip 200 in the second direction (the Y-axis direction). The first and second chiplets 200$c$11 and 200$c$12 may include first and second pads 201P and 202P, respectively, and may be electrically connected to a third group of connection pads 200P3 of the semiconductor chip 200 through a connection wiring 114 of the substrate 100. The chiplets may refer to individual chips constituting a multi-chip module (MCM). For example, the chiplets 200c11 and 200c12 may include at least one of an input/output circuit, an analog circuit, a memory circuit, or a series-parallel conversion circuit for the semiconductor chip 200. In other embodiments, the chiplets 200c11 and 200c12 may include at least one of a CPU, a GPU, or a field programmable gate array (FPGA). The number of chiplets mounted on the substrate 100 is not particularly limited, and a larger number of chiplets than those illustrated in the drawings may be mounted.

Figure 6A:
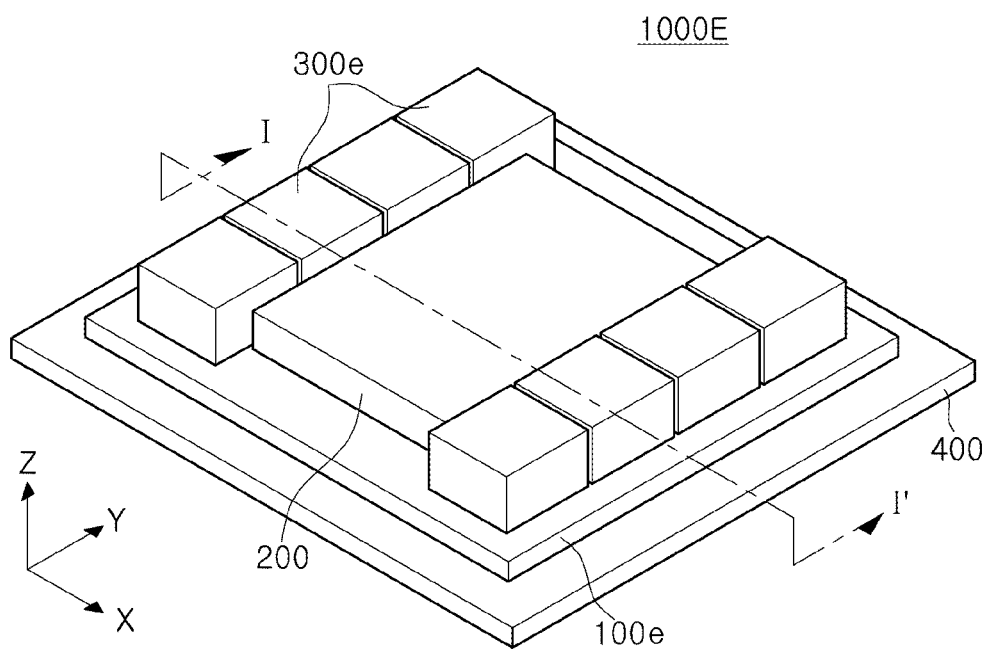
FIG. 6A is a perspective view illustrating a semiconductor device according to an embodiment of the present inventive concept.
Figure 6B:
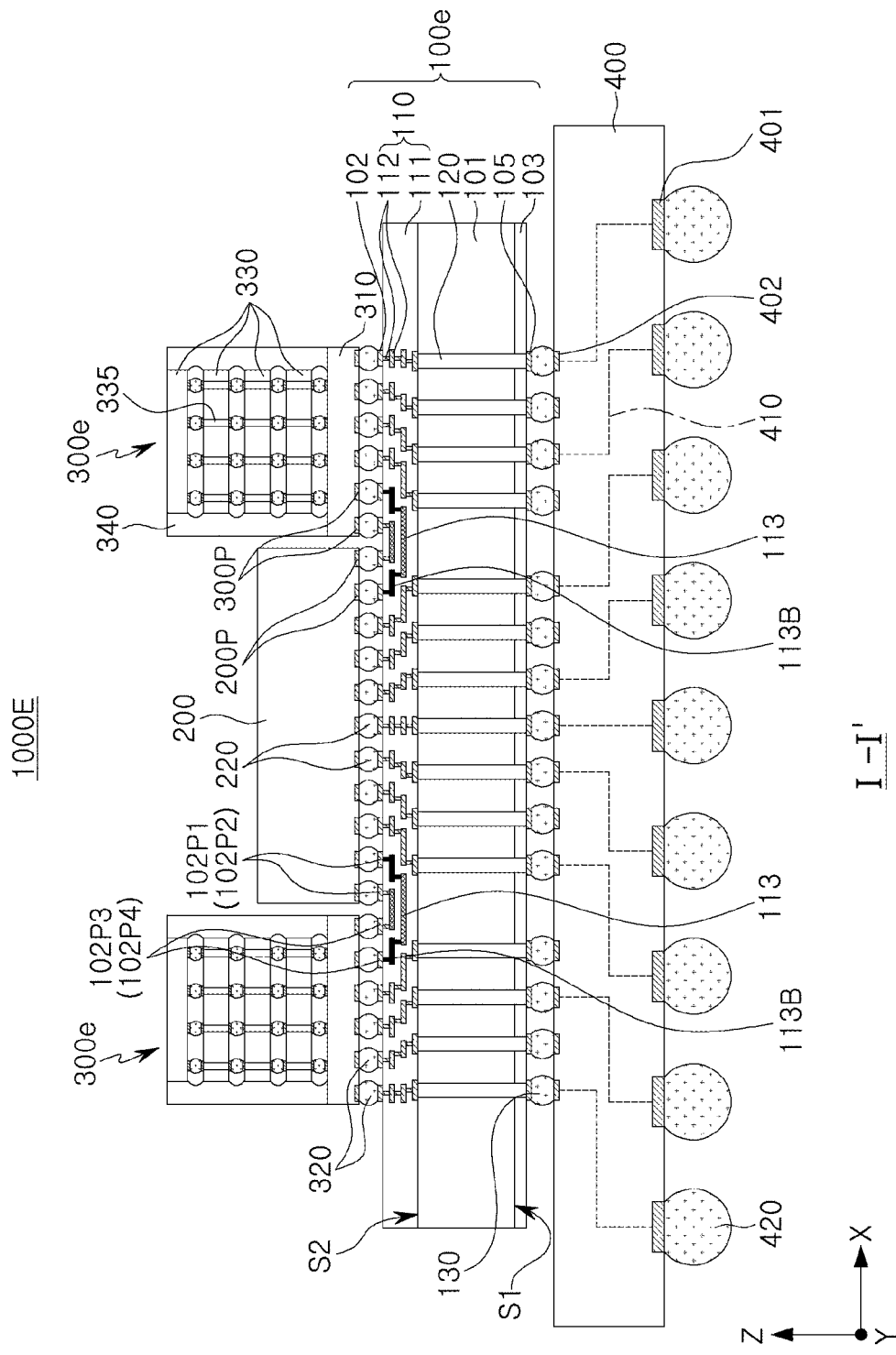
FIG. 6B is a cross-sectional view of FIG. 6A, taken along line I-I'.

FIG. 6A is a perspective view illustrating a semiconductor device 1000E according to an embodiment of the present inventive concept, and FIG. 6B is a cross-sectional view of FIG. 6A, taken along line I-I'.

Referring to FIGS. 6A and 6B, a semiconductor device 1000E according to an embodiment may be similar to those described with reference to FIGS. 1A to 5, except that a base substrate 400 disposed on a lower surface of a substrate 100e, and including a redistribution circuit 410 electrically connected to at least a portion of a plurality of pads 102, and at least a portion of a plurality of peripheral pads 102P3 and 102P4 is further included. In this embodiment, although the substrate 100e is illustrated as a silicon interposer substrate including a through silicon via (TSV), substrates applicable to the present inventive concept ('100' in FIGS. 1A to 5) are not limited thereto. Also, in the present embodiment, although a semiconductor structure 300e is illustrated as a memory device (e.g., HBM) in which a plurality of memory chips are stacked, semiconductor structures applicable to the present inventive concept ('300' in FIGS. 1A to 5) is not limited thereto.

The base substrate 400 may include a lower pad 401 disposed on a lower surface of a body thereof, an upper pad 402 disposed on an upper surface of the body, and a redistribution circuit 410 electrically connecting the lower pad 401 and the upper pad 402 to each other. The base substrate 400 may be a support substrate on which the substrate 100e, the semiconductor chip 200, and the semiconductor structure 300e are mounted, and may be a substrate for a semiconductor package including a printed circuit board (PCB), a ceramic substrate, a glass substrate, a tape wiring board, or the like. The body of the base substrate 400 may include different materials, depending on a type of the base substrate 400. For example, when the base substrate 400 is a printed circuit board, the body may be a copper clad laminate, or a form in which a wiring layer is additionally stacked on one side surface or both side surfaces of a copper clad laminate. Solder resist layers may be respectively formed on a lower surface and an upper surface of the base substrate 400. The lower and upper pads 401 and 402 and the redistribution circuit 410 may form an electrical path connecting the lower surface and the upper surface of the base substrate 400. The lower and upper pads 401 and 402 and the redistribution circuit 410 may be formed of a metal material, for example, an alloy including one or more metals, such as copper (Cu), aluminum (Al), nickel (Ni), silver (Ag), gold (Au), platinum (Pt), tin (Sn), lead (Pb), titanium (Ti), chromium (Cr), palladium (Pd), indium (In), and/or zinc (Zn). The redistribution circuit 410 may include multiple redistribution layers and a via connecting them. A first connection bump 420 connected to the lower pad 401 may be disposed on the lower surface of the base substrate 400. The first connection bump 420 may include tin (Sn), indium (In), bismuth (Bi), antimony (Sb), copper (Cu), silver (Ag), zinc (Zn), lead (Pb), and/or an alloy thereof. For example, the first connection bump 420 may have a spherical or ball shape including an alloy including tin (e.g., Sn—Ag—Cu).

The substrate 100e may include a semiconductor substrate 101, a circuit layer 110, and a through-via 120. A lower pad 105 (or 'bump pad') connected to a second connection bump 130 may be disposed on the lower surface of the substrate 100e, and an upper pad 102 connected to third connection bumps 220 and 320 may be disposed on an upper surface of the substrate 100e. The upper pad 102 may include pads 102P1 and 102P2 connected to a connection pad 200P of a semiconductor chip 200, and peripheral pads 102P3 and 102P4 connected to a signal pad 300P of the semiconductor structure 300e. The upper pad 102 may have a flat rectangular plate shape. A shape of the upper pad 102 is not limited to particular configurations in accordance with different embodiments of the inventive concept, and for example, the upper pad 102 may have a circular or elliptical flat plate or a polygonal flat plate shape other than a quadrangle. The upper pad 102 may include, for example, one or more metal materials, such as aluminum (Al), copper (Cu), nickel (Ni), tungsten (W), platinum (Pt), and/or gold (Au). A material of the upper pad 102 is not limited to the above materials in accordance with different embodiments of the inventive concept.

The semiconductor substrate 101 may have a first surface S1 facing the base substrate 400, and a second surface S2 opposite to the first surface S1. The semiconductor substrate 101 may include a semiconductor element, such as silicon and germanium, or a compound semiconductor, such as silicon carbide (SiC), gallium arsenide (GaAs), indium arsenide (InAs), and indium phosphide (InP). A protective layer 103 may be formed on the first surface S1 of the semiconductor substrate 101. The protective layer 103 may be formed of an insulating layer, such as a silicon oxide film, a silicon nitride film, a silicon oxynitride film, or the like. A material of the protective layer 103 is not limited to the above materials in accordance with different embodiments of the inventive concept. For example, the protective layer 103 may be formed of a polymer, such as polyimide (PI). Also, although not illustrated, the protective layer may be formed on an upper surface of the circuit layer 110.

The circuit layer 110 may be disposed on the second surface S2 of the semiconductor substrate 101 and may include an interlayer insulating layer 111, and a wiring structure 112 including a multilayer pattern layer and a contact via. The interlayer insulating layer 111 may include silicon oxide or silicon nitride. The wiring structure 112 may interconnect the semiconductor chip 200 and the semiconductor structure 300e, or may connect them to the through-via 120. The contact via may interconnect the multilayer pattern layers or connect the multilayer pattern layers to the upper pad 102.

The wiring structure 112 may include a wiring pattern 113 connecting the pads 102P1 and 102P2 and the peripheral pads 102P3 and 102P4. The wiring pattern 113 may have similar characteristics to the wiring patterns 113-1 and 113-2 described with reference to FIGS. 1A to 4. In addition, the wiring pattern 113 may be connected to the pads 102P1 and 102P2 and the peripheral pads 102P3 and 102P4 through a pad connection portion 113B, and the pad connection portion 113B may have features similar to that described with reference to FIGS. 2A to 4. Although the pad connection portion 113B illustrated in FIGS. 2A to 4 is illustrated to form a single layer extending on an X-Y plane, the pad connection portion 113B illustrated in FIG. 6B may be configured to form a multilayer. According to embodiments of the present inventive concept, an angle of the wiring pattern 113 may be adjusted on the X-Y plane, according to arrangement of the pads 102P1 and 102P2 and the peripheral pads 102P3 and 102P4, to improve signal characteristics between the semiconductor chip 200 and the semiconductor structure 300e.

The through-via 120 may be a through silicon via (TSV) penetrating the semiconductor substrate 101 in the vertical direction (the Z-axis direction). The through-via 120 may provide an electrical path connecting the lower pad 105 and the upper pads 102 of the substrate 100e. The through-via 120 may include a conductive plug and a barrier film bordering or surrounding the conductive plug. The conductive plug may include a metal material, such as, for example, tungsten (W), titanium (Ti), aluminum (Al), and/or copper (Cu). The conductive plug may be formed by a plating process, a PVD process, or a CVD process. The barrier film may include an insulating barrier film and/or a conductive barrier film. The insulating barrier film may be formed of an oxide film, a nitride film, a carbide film, a polymer film, or a combination thereof. The conductive barrier film may be disposed between the insulating barrier film and the conductive plug. The conductive barrier film may include, for example, a metal compound, such as tungsten nitride (WN), titanium nitride (TiN), and/or tantalum nitride (TaN). The conductive barrier film may be formed by a PVD process or a CVD process.

Because the semiconductor chip 200 and the semiconductor structure 300e have similar characteristics to those described with reference to FIGS. 1A and 1B, overlapping descriptions thereof will be omitted. At least a portion of the connection pads 200P of the semiconductor chip 200 may be connected to the pads 102P1 and 102P2 of the substrate 110e through a 3-1 connection bump 220. A remaining portion of the connection pads 200P may be connected to a remaining portion of the upper pads 102 of the substrate 110e through the 3-1 connection bump 220, and may be configured to transmit a signal of the semiconductor chip 200 to the outside of the semiconductor chip 200, or may transmit a signal and power supplied from outside of the semiconductor chip 200 to the semiconductor chip 200. The signal pads 300P of the semiconductor structure 300e may be connected to the peripheral pads 102P3 and 102P4 of the substrate 110e through a 3-2 connection bump 320. Remaining pads below the semiconductor structure 300e may be also connected to the upper pad 102 of the substrate 110e through the 3-2 connection bump 320, and may be configured to transmit a signal of the semiconductor structure 300e to the outside of the semiconductor structure 300e, or may transmit a signal and power supplied from outside of the semiconductor structure 300e to the semiconductor structure 300e.

The semiconductor structure 300e may include a base chip 310 and a plurality of semiconductor chips 330. The number of the plurality of semiconductor chips 330 stacked on the base chip 310 is not limited to those illustrated in the drawings in accordance with various embodiments of the inventive concept, for example, 3 or less or 5 or more semiconductor chips 330 may be stacked on the base chip 310. The base chip 310 may be formed, based on a semiconductor material, such as a silicon (Si) wafer or the like, and may include a TSV penetrating a body thereof. Embodiments of the present inventive concept are not limited thereto, and the base chip 310 may be a PCB, a glass substrate, or the like that does not include a semiconductor material. The base chip 310 may be a buffer die capable of receiving at least one of a control signal, a power signal, and a ground signal for operation of the plurality of semiconductor chips 330 from the outside, receiving a data signal to be stored in the plurality of semiconductor chips 330 from the outside, or providing data stored in the plurality of semiconductor chips 330 externally.

The plurality of semiconductor chips 330 may be stacked on the base chip 310 in the vertical direction (the Z-axis direction), and may be connected to each other through TSVs 335 penetrating some of the semiconductor chips 330. The plurality of semiconductor chips 330 may include a volatile memory device such as DRAM, static RAM (SRAM), and the like, a nonvolatile memory device such as PRAM, MRAM, RRAM, a flash memory device, and the like, or the like. The plurality of semiconductor chips 330 may be configured to store or output data based on a signal provided from the base chip 310. A conductive bump and an insulating film bordering or surrounding the conductive bump may be disposed between the plurality of semiconductor chips 330. Also, the plurality of semiconductor chips 330 may be bordered or surrounded by a molding member 340. The molding member 340 may include an insulating resin, for example, a prepreg, Ajinomoto build-up film (ABF), FR-4, bismaleimide triazine (BT), an epoxy molding compound (EMC), or the like.

Figure 7:
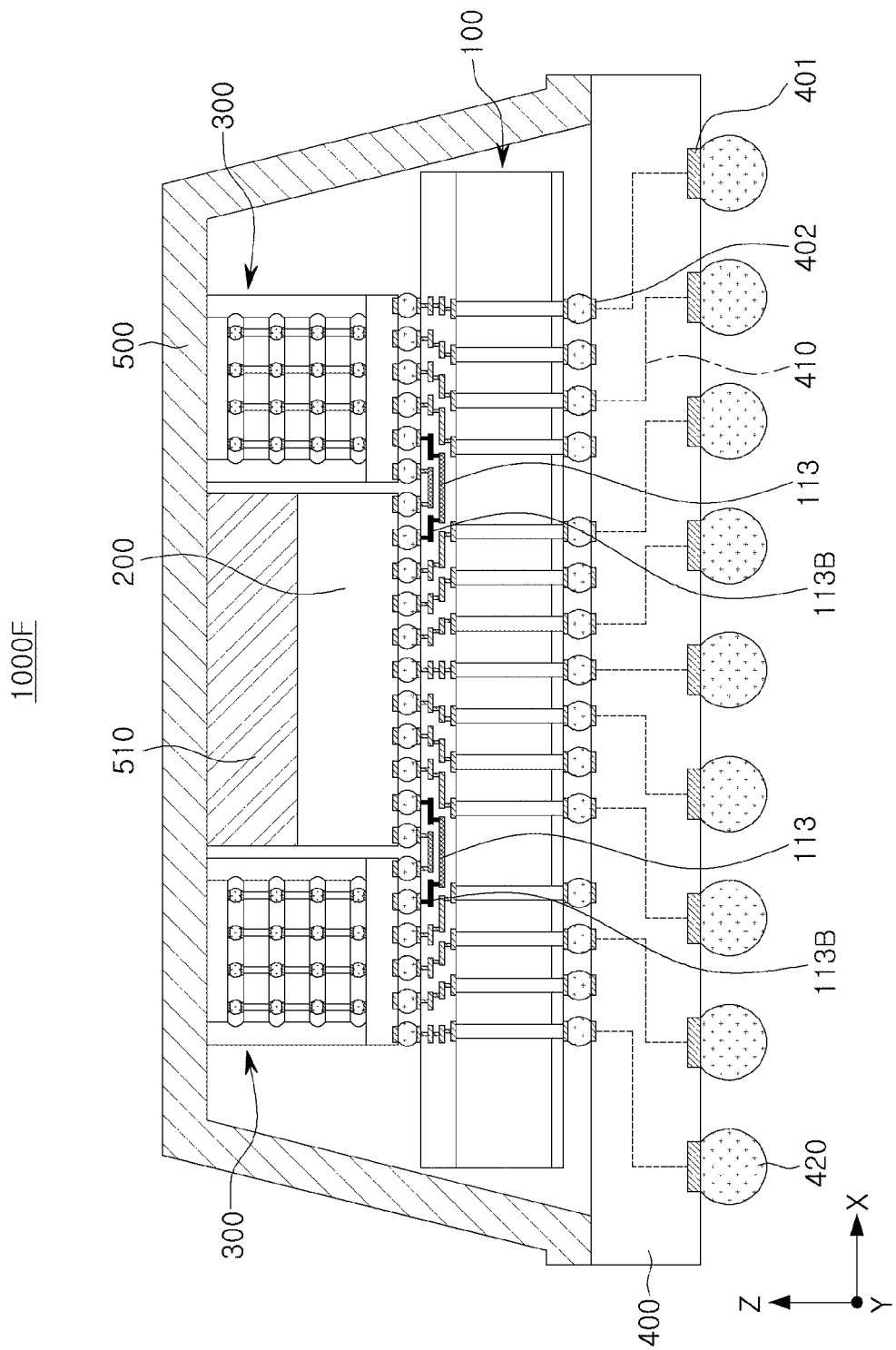
FIG. 7 is a cross-sectional view illustrating a semiconductor device according to an embodiment of the present inventive concept.

FIG. 7 is a cross-sectional view illustrating a semiconductor device 1000F according to an embodiment of the present inventive concept.

Referring to FIG. 7, a semiconductor device 1000F according to an embodiment may be similar to those described with reference to FIGS. 6A and 6B, except that a heat dissipation structure 500 disposed on a base substrate 400 and at least partially covering a semiconductor chip 200 and a semiconductor structure 300 is further included.

The heat dissipation structure 500 may be fixed to the base substrate 400 by an adhesive member 510, to control warpage of the semiconductor device 1000F, and to dissipate heat generated by the semiconductor chip 200 and the semiconductor structure 300 externally. The heat dissipation structure 500 may have a shape completely covering the semiconductor chip 200, the semiconductor structure 300, and a substrate 100, but embodiments of the inventive concept are not limited thereto. For example, the heat dissipation structure 500 may have a plate shape covering only an upper surface of the semiconductor chip 200 and an upper surface of the semiconductor structure 300. The heat dissipation structure 500 may include a material having generally excellent thermal conductivity, for example, aluminum (Al), gold (Au), silver (Ag), copper (Cu), iron (Fe), graphite, graphene, or the like. The adhesive member 510 may be interposed between the heat dissipation structure 500 and the semiconductor chip 200. The adhesive member 510 may include, for example, a thermally conductive adhesive tape, a thermally conductive grease, a thermally conductive adhesive, or the like.

FIGS. 8A to 8F are cross-sectional views illustrating a method of manufacturing the substrate 100e illustrated in FIG. 6B using a process sequence according to embodiments of the inventive concept.

Figure 8A:
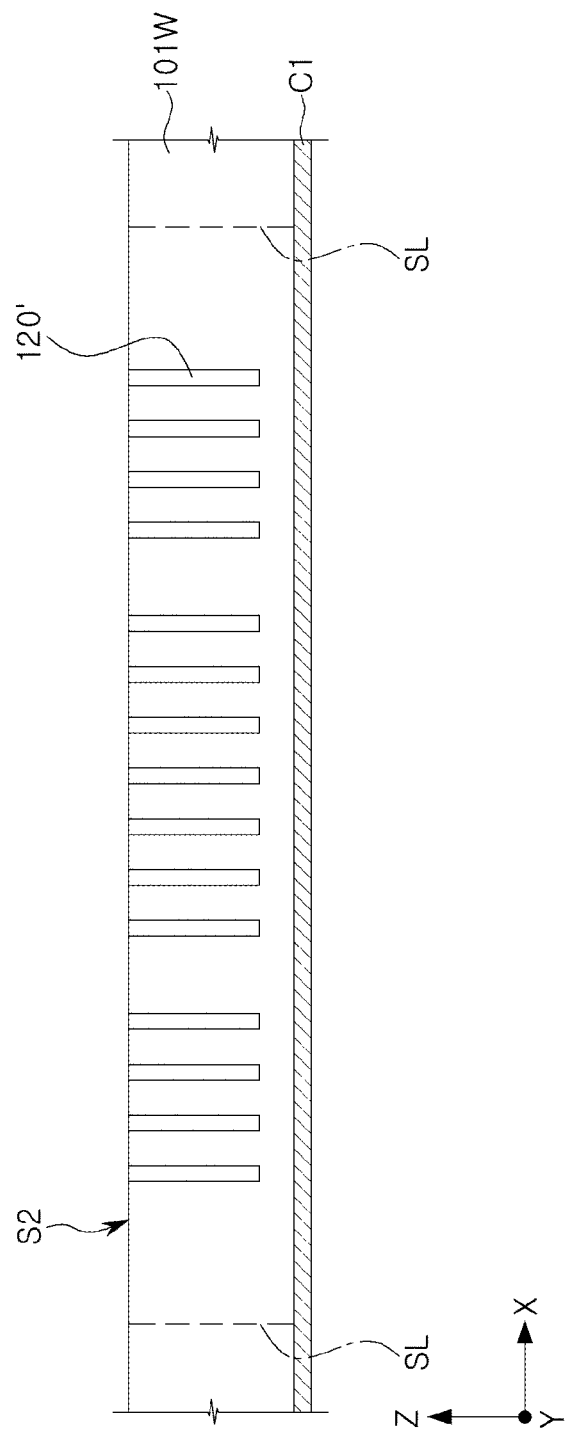
FIGS. 8A to 8F are cross-sectional views illustrating a method of manufacturing the substrate illustrated in FIG. 6B using a process sequence according to an embodiment of the present inventive concept.

Referring to FIG. 8A, first, a semiconductor wafer may be attached on a first carrier C1, and a through-via 120' extending into a semiconductor substrate 101W may be formed. The semiconductor wafer may include a plurality of semiconductor substrates 101W separated by a scribe lane SL. The through-via 120' may extend inwardly from a second surface S2 of the semiconductor substrate 101W. The through-via 120' may be formed to have a columnar shape at least partially filling a via hole, and may include a barrier layer formed on a surface of the columnar shape, and a buried conductive layer filling an inner space of the barrier layer. The through-via 120' may be formed using an etching process for forming the via hole, an oxidation process and a plating process for forming the barrier layer and the buried conductive layer in the via hole, a planarization process, and the like.

Figure 8B:
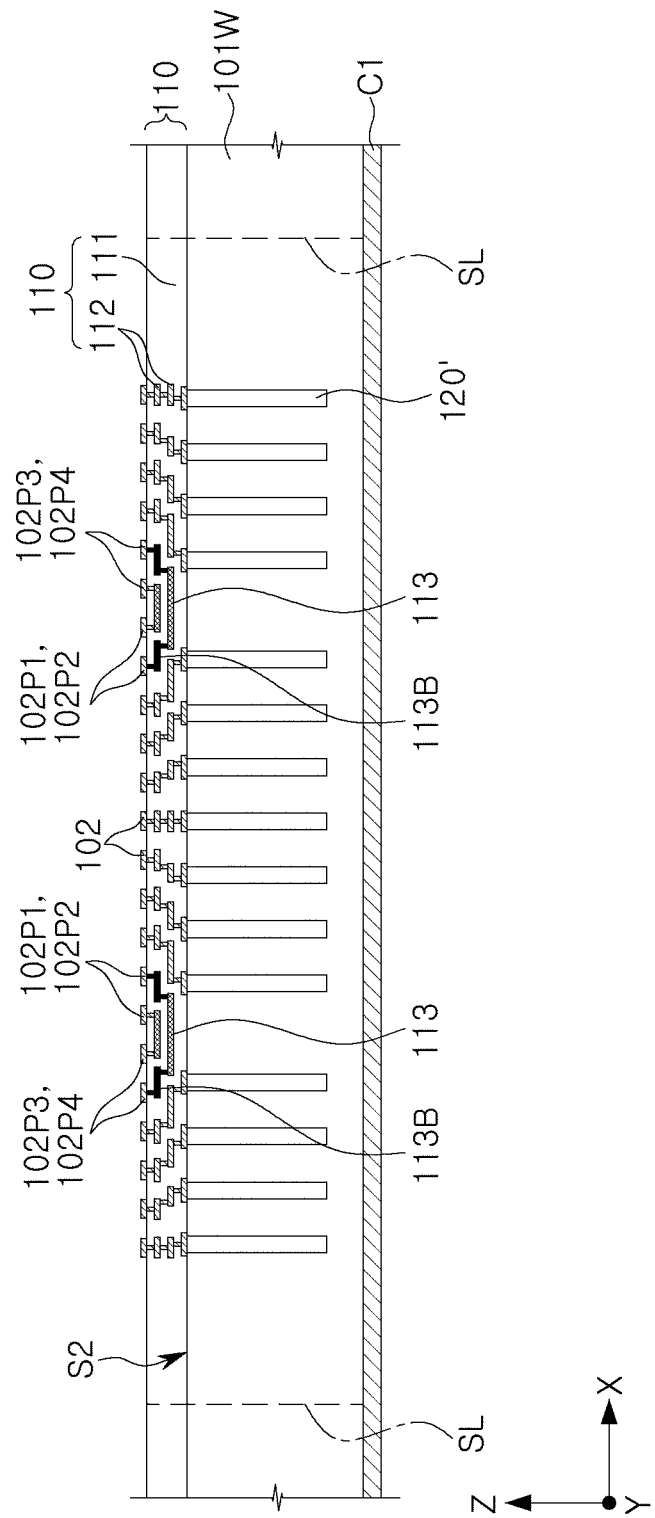

Referring to FIG. 8B, a circuit layer 110 may be formed on the plurality of semiconductor substrates 101W. The circuit layer 110 may include an interlayer insulating layer 111 and a wiring structure 112. The interlayer insulating layer 111 and the wiring structure 112 may be formed by repeatedly performing an oxidation process, a photolithography process, an etching process, a plating process, and the like. A substrate applied to embodiments of the present inventive concept may include pads 102P1 and 102P2 and peripheral pads 102P3 and 102P4, having a specific arrangement, and wiring patterns 113 of which a routing angle is adjusted according to the arrangement. Angles of the wiring patterns 113 may be adjusted by designing a pattern of a photomask used in a photolithography process. Embodiments of the present inventive concept may include a substrate including the wiring patterns 113 of fine pitch connecting the pads 102P1 and 102P2 and the peripheral pads 102P3 and 102P4. Signal characteristics of the wiring pattern 113 may be improved by adjusting the angles of the wiring patterns 113 on an X-Y plane. Pad connection portions 113B connected to the wiring patterns 113 may also be formed by repeating the same process as the wiring patterns 113.

Figure 8C:
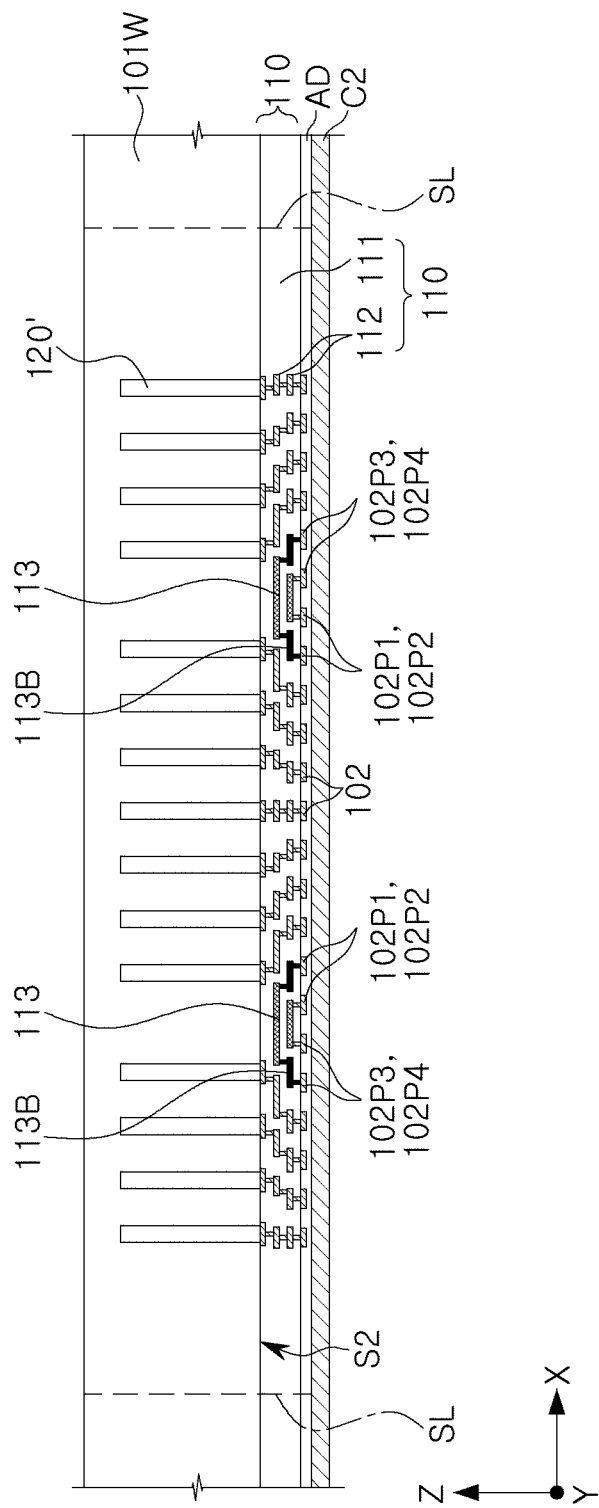

Referring to FIG. 8C, the wafer (or the plurality of semiconductor substrates 101W) of FIG. 8B may be inverted, and may be attached to a second carrier C2. An adhesive layer AD may be provided on a surface of the second carrier C2, and an upper pad 102 on the circuit layer 110 may be buried in the adhesive layer AD. In this case, an upper portion of the through-via 120' may be buried in the semiconductor substrate 101W. In a subsequent process (FIGS. 8D and 8E), a portion of the through-via 120' may be exposed to be connected to a lower pad 105.

Figure 8D:
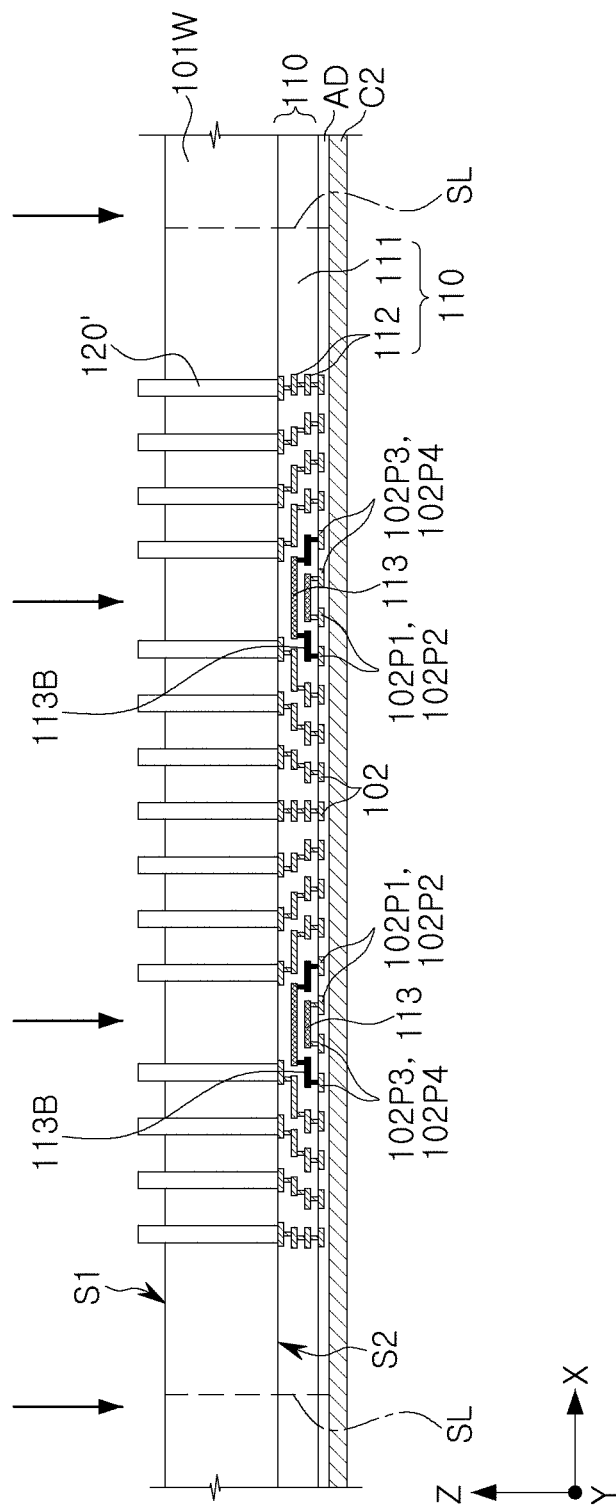

Referring to FIG. 8D, a portion of the semiconductor substrate 101W may be removed to form a first surface S1 exposing a portion of the through-via 120'. In an example, a portion of the semiconductor substrate 101W may be removed, such that a portion of the through-via 120' protrudes onto the first surface S1. Therefore, the through-via 120' may have a shape completely penetrating the semiconductor substrate 101W. A portion of the semiconductor substrate 101W may be removed by a chemical mechanical polishing (CMP) process, an etch-back process, or a combination thereof.

Figure 8E:
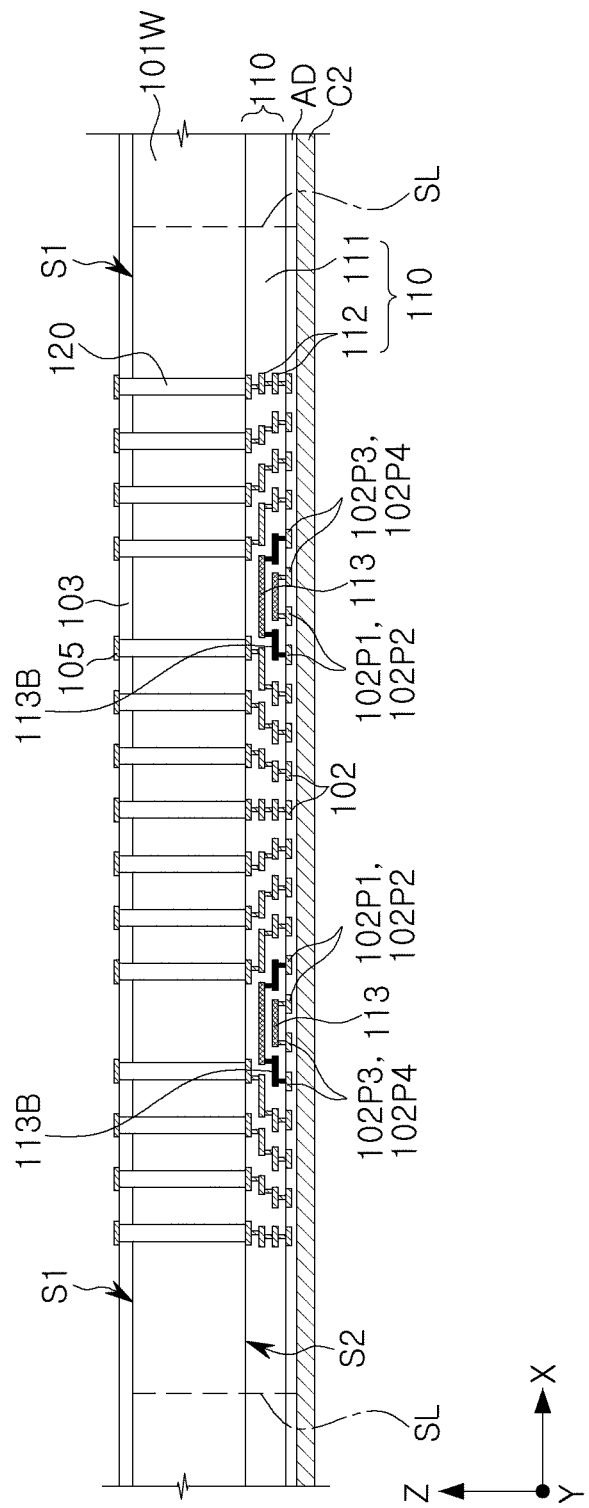

Referring to FIG. 8E, a protective layer 103 and the lower pad 105 may be formed on the first surface S1 of the semiconductor substrate 101W. The protective layer 103 may be formed by forming an insulating polymer film at least partially covering the first surface S1 of the semiconductor substrate 101W and then partially removing the insulating polymer film to expose a through-via 120. The lower pad 105 may be formed using a photolithography process, a plating process, or the like. The insulating polymer film may be formed by, for example, a spin coating process or a spray process. The lower pad 105 may be formed to contact the through-via 120 exposed from the protective layer 103. In an example, the lower pad 105 may be electrically connected to the through-via 120 through a wiring layer and a contact via.

Figure 8F:
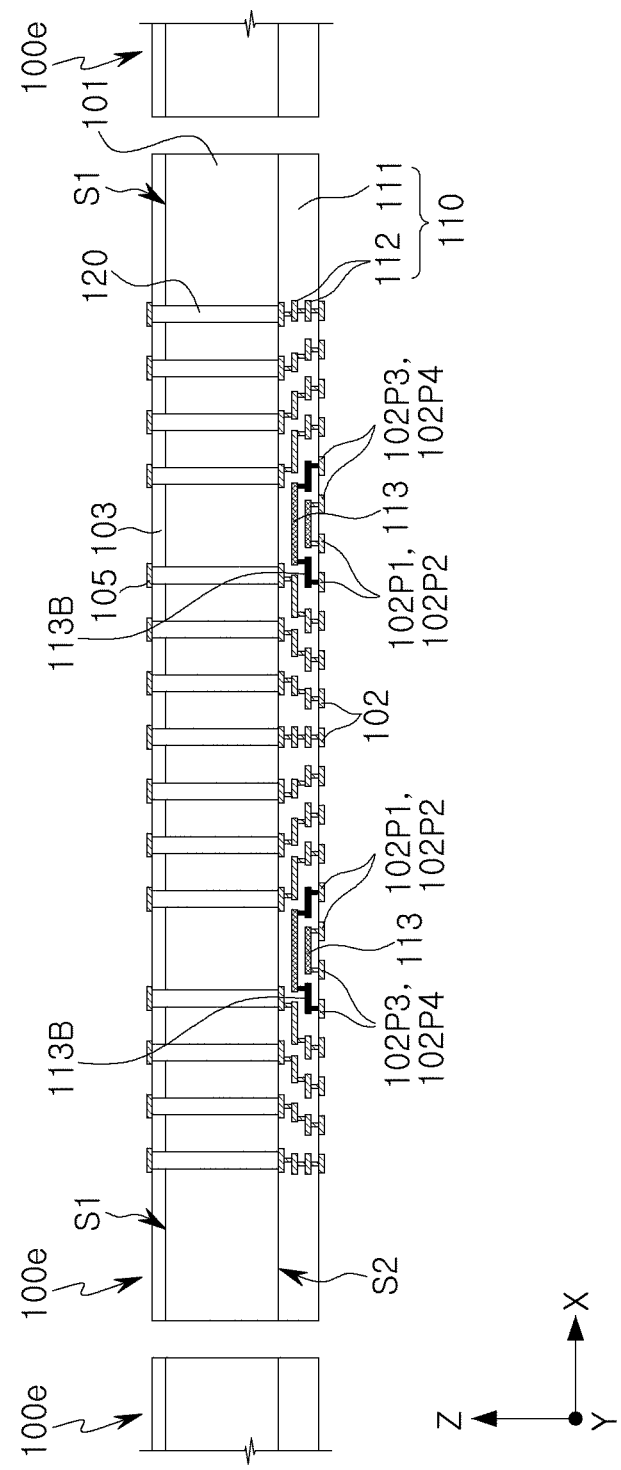

Referring to FIG. 8F, the semiconductor substrate 101W of FIG. 8E may be cut along the scribe lane SL to separate the substrates, which is a wafer, into a plurality of substrates 100e. The substrates 100e, which have been separated, may include a plurality of pads 102P1 and 102P2, a plurality of peripheral pads 102P3 and 102P4 spaced apart from the plurality of pads 102P1 and 102P2 in the first direction (the X-axis direction), and a plurality of wiring patterns 113 electrically connecting at least a portion of the plurality of pads 102P1 and 102P2 to at least a portion of the plurality of peripheral pads 102P3 and 102P4. The plurality of wiring patterns 113 may include multilayer wiring patterns located on different levels in the third direction (the Z-axis direction).

As described with reference to FIGS. 1A to 4, the substrate 100e manufactured according to the above-described process, which may be an interposer, may improve signal characteristics of wiring patterns 113, formed with fine pitches, by adjusting angles of the wiring patterns 113 on an X-Y plane according to arrangement between the pads 102P1 and 102P2 and the peripheral pads 102P3 and 102P4.

According to embodiments of the present inventive concept, a semiconductor device having generally excellent signal characteristics may be provided by introducing a wiring pattern having a predetermined angle under a specific condition.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
   a semiconductor chip;
   a first semiconductor structure adjacent to the semiconductor chip in a first direction;
   a second semiconductor structure adjacent to the semiconductor chip in the first direction and spaced apart from the first semiconductor structure in a second direction, perpendicular to the first direction; and
   a substrate including a plurality of pads electrically connected to the semiconductor chip, a plurality of first and second peripheral pads electrically connected to the first and second semiconductor structures, a plurality of first wiring patterns respectively connecting a first group of pads, among the plurality of pads, to the plurality of first peripheral pads, and a plurality of second wiring patterns respectively connecting a second group of pads, among the plurality of pads, to the plurality of second peripheral pads, and on which the semiconductor chip and the first and second semiconductor structures are mounted,
   wherein the first group of pads and the plurality of first peripheral pads, adjacent to each other, are spaced apart by a first horizontal gap in the first direction, and the first group of pads and the plurality of first peripheral pads, connected to each other, are spaced apart by a first vertical gap, greater than the first horizontal gap, in the second direction,
   wherein the second group of pads and the plurality of second peripheral pads, adjacent to each other, are spaced apart from each other by a second horizontal gap in the first direction, and the second group of pads and the plurality of second peripheral pads, connected to each other, are spaced apart by a second vertical gap, equal to or less than the second horizontal gap, in the second direction,
   wherein the plurality of first wiring patterns include first horizontal extension portions extending at an angle exceeding about 45 degrees with respect to the first direction within the first horizontal gap, and wherein the plurality of second wiring patterns include second horizontal extension portions extending at an angle of about 45 degrees or less with respect to the first direction within the second horizontal gap.

2. The semiconductor device of claim 1, wherein the first horizontal gap is substantially equal to the second horizontal gap.

3. The semiconductor device of claim 1, wherein a ratio of the first vertical gap to the first horizontal gap is about 1.5 or more.

4. The semiconductor device of claim 1, wherein a ratio of the second vertical gap to the second horizontal gap is about 1 or less.

5. The semiconductor device of claim 1, wherein a gap between the first horizontal extension portions is less than a gap between the second horizontal extension portions.

6. The semiconductor device of claim 1, wherein the plurality of first wiring patterns further comprise vertical extension portions extending from each of one set of ends of the first horizontal extension portions at an angle of about 90 degrees with respect to the first direction within the first horizontal gap.

7. The semiconductor device of claim 1, wherein, in the second direction, the first semiconductor structure is closer to an edge of the substrate compared to the semiconductor chip.

8. The semiconductor device of claim 1, wherein, in the second direction, the first semiconductor structure is closer to an edge of the substrate compared to the second semiconductor structure.

9. The semiconductor device of claim 1, wherein a width of the semiconductor chip in each of the first and second directions is greater than a width of each of the first and second semiconductor structures in each of the first and second directions.

10. A semiconductor device comprising:
a semiconductor chip including first and second connection pads;
a first semiconductor structure adjacent to the semiconductor chip in a first direction and including a first signal pad electrically connected to the first connection pad;
a second semiconductor structure adjacent to the semiconductor chip in the first direction, spaced apart from the first semiconductor structure in a second direction, perpendicular to the first direction, and including a second signal pad electrically connected to the second connection pad; and
a substrate including a first wiring pattern connecting the first connection pad and the first signal pad, and a second wiring pattern connecting the second connection pad and the second signal pad,
wherein a first vertical gap between the first connection pad and the first signal pad in the second direction is greater than a second vertical gap between the second connection pad and the second signal pad in the second direction,
wherein the first wiring pattern includes a first horizontal extension portion extending between the first connection pad and the first signal pad at a first angle with respect to the first direction, and
wherein the second wiring pattern includes a second horizontal extension portion extending between the second connection pad and the second signal pad at a second angle, less than the first angle, with respect to the first direction.

11. The semiconductor device of claim 10, wherein the first angle is about 60 degrees or greater, and the second angle is about 45 degrees or less.

12. The semiconductor device of claim 10, wherein at least one of the first and second wiring patterns further comprise a vertical extension portion extending from one end of the first or second horizontal extension portion at a third angle, greater than the first and second angles, with respect to the first direction.

13. The semiconductor device of claim 12, wherein a length of the vertical extension portion is shorter than a length of each of the first and second horizontal extension portions.

14. The semiconductor device of claim 10, wherein the semiconductor chip includes a logic chip, and
wherein each of the first and second semiconductor structures includes a plurality of memory chips.

15. The semiconductor device of claim 10, further comprising a chiplet disposed adjacent to the semiconductor chip in the second direction and including one or more of an input/output circuit, an analog circuit, a memory circuit, and a series-parallel conversion circuit for the semiconductor chip.

16. A semiconductor device comprising:
a substrate;
a semiconductor chip on the substrate; and
a semiconductor structure adjacent to the semiconductor chip in a first direction and offset from the semiconductor chip in a second direction, perpendicular to the first direction, to be adjacent to an edge of the substrate,
wherein the substrate includes a plurality of pads connected to the semiconductor chip, a plurality of peripheral pads connected to the semiconductor structure, and a plurality of wiring patterns electrically connecting at least a portion of the plurality of pads to at least a portion of the plurality of peripheral pads,
wherein a separation distance between the at least a portion of the plurality of pads and the at least a portion of the plurality of peripheral pads, corresponding to each other, in the second direction is longer than a shortest distance between the at least a portion of the plurality of pads and the at least a portion of the plurality of peripheral pads in the first direction, and
wherein the plurality of wiring patterns include horizontal extension portions extending at an angle greater than about 45 degrees to less than about 90 degrees with respect to the first direction and vertical extension portions extending from the horizontal extension portions at an angle of about 90 degrees with respect to the first direction between the at least a portion of the plurality of pads and the at least a portion of the plurality of peripheral pads.

17. The semiconductor device of claim 16, wherein a ratio of a length of each of the vertical extension portions in the second direction to the separation distance in the second direction is about 0.2 or less.

18. The semiconductor device of claim 16, wherein a length of each of the vertical extension portions in a first extension direction is shorter than a length of each of the horizontal extension portions in a second extension direction.

19. The semiconductor device of claim 16, wherein a minimum gap between the vertical extension portions is less than a minimum gap between the horizontal extension portions.

20. The semiconductor device of claim 16, further comprising:
- a base substrate on a lower surface of the substrate and including a redistribution circuit electrically connected to the at least a portion of the plurality of pads and the at least a portion of the plurality of peripheral pads; and
- a heat dissipation structure on the base substrate and at least partially covering the semiconductor chip and the semiconductor structure.

* * * * *